Figure 1:
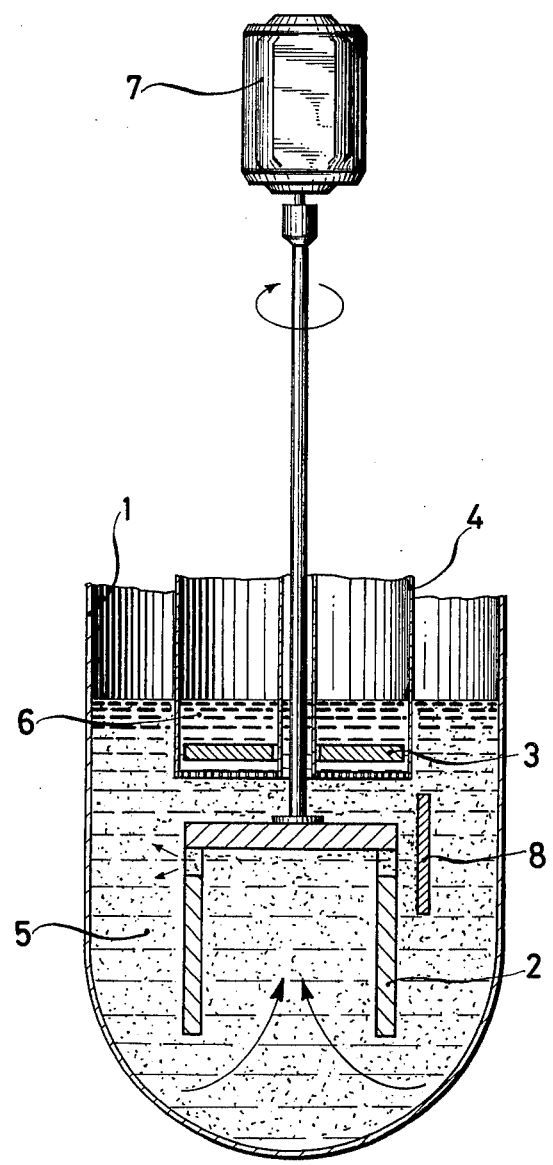

United States Patent [19]

Faul et al.

[11] 4,131,523
[45] Dec. 26, 1978

[54] METHOD OF ELECTROCHEMICALLY PROCESSING METALLIC SURFACES

[75] Inventors: Wolfgang Faul, Julich; Bertel Kastening, Hamburg, both of Fed. Rep. of Germany

[73] Assignee: Kernforschungsanlage Jülich Gesellschaft mit beschränkter Haftung, Julich, Fed. Rep. of Germany

[21] Appl. No.: 857,570

[22] Filed: Dec. 5, 1977

[30] Foreign Application Priority Data

Dec. 4, 1976 [DE] Fed. Rep. of Germany ....... 2655137

[51] Int. Cl.² ........................ C25F 3/02; C25F 3/14
[52] U.S. Cl. ............................. 204/129.1; 204/129.7
[58] Field of Search ............ 204/129.1, 129.6, 129.65, 204/129.7, 273, 275, DIG. 10, DIG. 2

[56] References Cited

U.S. PATENT DOCUMENTS

| 3,208,923 | 9/1965 | Feiner et al. ..................... 204/129.6 |
| 3,523,834 | 8/1970 | Hewins ................................ 204/273 |
| 3,974,050 | 8/1976 | Divisek ............................ 204/129.6 |

Primary Examiner—T. M. Tufariello
Attorney, Agent, or Firm—Walter Becker

[57] ABSTRACT

A method of electrochemically processing metallic surfaces of workpieces which are arranged so as not to contact the cathode and anode. The processing is done with an electrolyte which, for conducting an electric charge to the surface to be processed, contains electrically conductive bodies suspended in the electrolyte. The electrically conductive bodies, in an electrolysis cell, are charged on the electrode intended for processing the surface and are protected against discharging on the counterelectrode of the electrolysis cell by a diaphragm which shields the counterelectrode. As electrically conductive bodies, particles of activated carbon powder heated at above 700° C in an inert atmosphere are suspended in the electrolyte.

5 Claims, 3 Drawing Figures

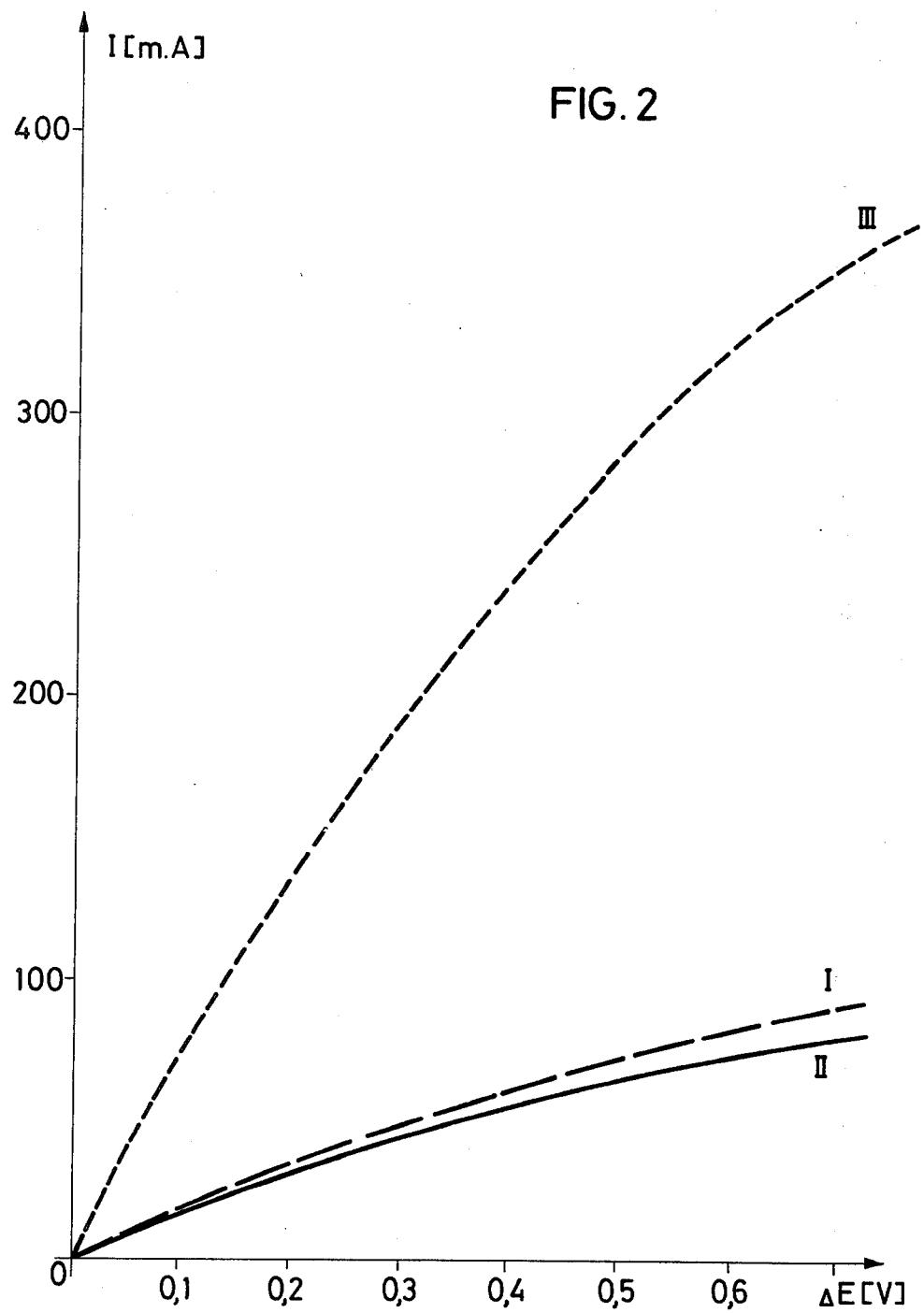

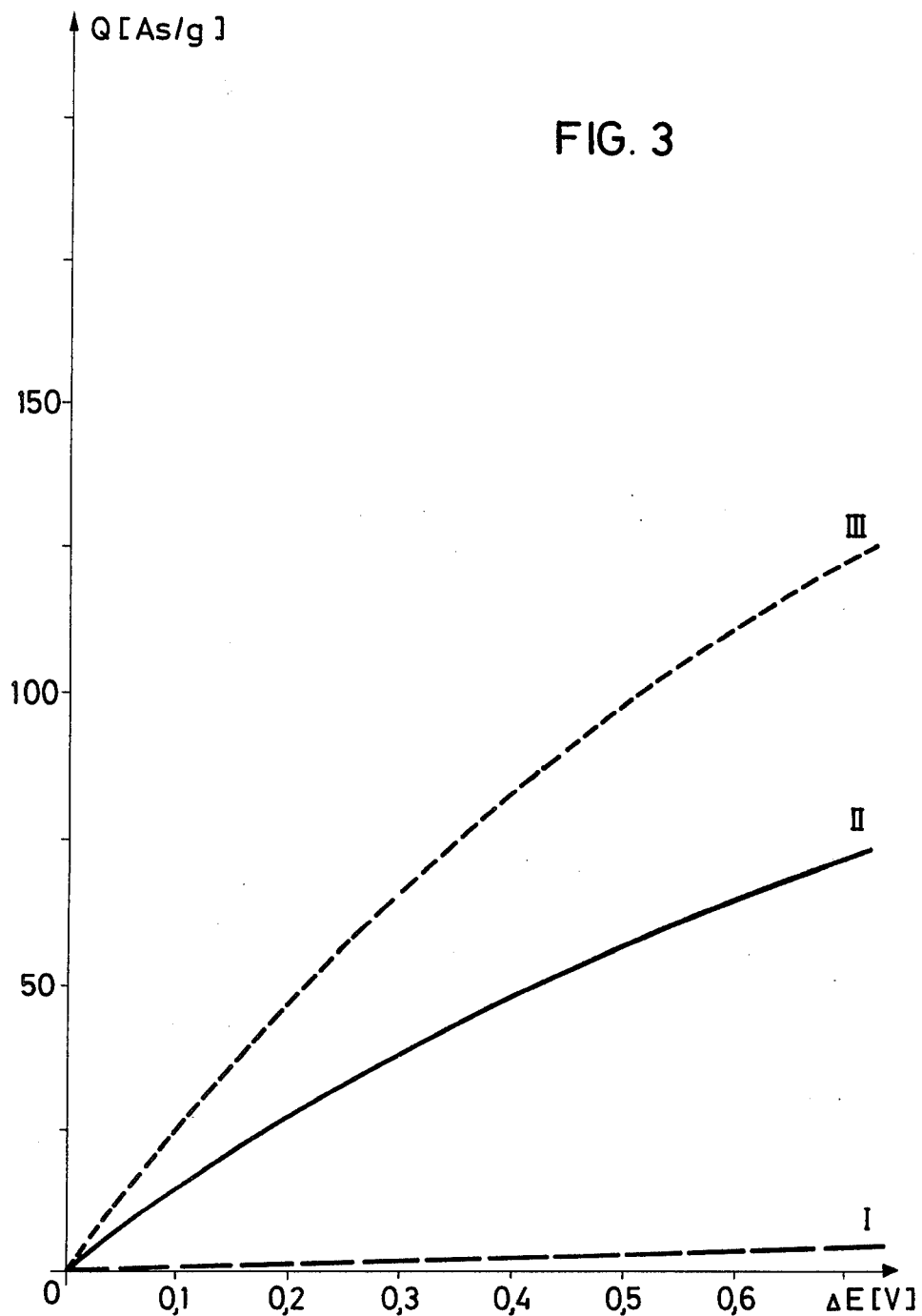

METHOD OF ELECTROCHEMICALLY PROCESSING METALLIC SURFACES

The present invention relates to a method of electrochemically processing metallic surfaces of workpieces, which are arranged so as not to contact the cathode and anode, with an electrolyte which, for conducting an electric charge to the surface to be processed, contains electrically conductive bodies suspended in the electrolyte. The electrically conductive bodies, in an electrolysis cell, are charged on the electrode intended for processing the surface and are protected against discharging on the counter-electrode of the electrolysis cell by a diaphragm which shields the counterelectrode.

Pursuant to this method, printed circuits are produced. Plates of synthetic material are coated with copper on one or both sides. Those metal surfaces thereon which form the circuit are covered with a protective layer. Those portions of the copper coating which remain uncovered are then removed. In so doing, the electrically conductive bodies suspended in the electrolyte are positively charged on the anode of an electrolysis cell and subsequently, together with the electrolyte, are brought into contact with the surface of the copper layer. As a result, metal ions are released and are again deposited on the cathode of the electrolysis cell. The method is also used to produce metallic molded parts, for which high precision and well defined contours are important, such as for parts which guide flow, such as turbine blades and nozzles, or also for the manufacture of the surface relief of printing plates or rollers. The direct recovery, made possible with this method, of the removed metals which are deposited on the counter-electrode leads to an economical and at the same time environmentally favorable method. This advantage of the method is particularly utilized for the recovery of metals from so-called cable scrap.

For this method, which is described in U.S. Pat. No. 3,974,050 issued 10 Aug. 1976, it is known to add graphite powder to the electrolyte. The particles of graphite are suspended in the electrolyte as conductive bodies and handle the conveyance of the charge between the anode and the surface of the workpiece to be processed, which charge is required for removing the metal. The graphite particles have a good electrical conductivity, as do the bodies of insulating material which are coated with a metal layer and which are also known from the patent. A drawback, however, is the relatively small specific surface which limits the conveyable electric charge per weight unit of suspended bodies and, as a result thereof, does not in all cases lead to a sufficiently economic realization of the method.

It is therefore an object of the present invention to develop an electrochemical method for processing metallic surfaces, according to which the quantity of conductive bodies suspended in the electrolyte and required to bring a specific amount of metal into solution is reduced, and a shortening of the processing time required for removal of the metallic surfaces is made possible.

This object and other objects and advantages of the present invention will appear more clearly from the following specification and examples in connection with the accompanying drawings which schematically clearly illustrate the manner of operation of activated carbon powder suspended in electrolyte. Specifically:

FIG. 1 shows an apparatus for carrying out the method of the present invention;

FIG. 2 is a graph showing current transmission I as a function of potential difference $\Delta E$ between particles suspended in the electrolyte and metallic surface to be processed; and FIG. 3 is a graph showing the recorded quantity of charge Q, usable for dissolving metal, per gram of suspended particles plotted as a function of the potential difference $\Delta E$ between suspended particles and metallic surface to be processed.

The method pursuant to the present invention is characterized primarily in that, as electrically conductive bodies, particles of activated carbon powder heated at above 700° C in an inert atmosphere are suspended in the electrolyte. It has been found that activated carbon particles treated in this manner not only have a very large specific surface, but are also suitable for conducting an electric charge, so that, with this use of such particles of activated carbon powder suspended in the electrolyte, the quantity of conductive bodies to be added for a specific amount of metal to be dissolved is decreased, and a considerable acceleration of the removal of the metallic layers is achieved. The heating of the activated carbon powder in inert atmosphere is preferably carried out in a nitrogen atmosphere or in a vacuum. Air and water vapor however are also suitable if, by small dosing of these gases, care is taken that the surface of the activated carbon is chemically only relatively slightly attacked. Preferably used are particles of activated carbon powder which have been heated in a temperature range between 900 and 1200° C for more than one hour.

Pursuant to a further embodiment of the present invention, particles of graphite powder are added to the particles of activated carbon powder. In so doing, in an advantageous manner, the potential difference between the metallic surfaces to be processed and the suspended electrically conductive bodies is increased, as is the profitability of the method. In this connection, the good electrical conductivity of the graphite powder particles, and the high storing capacity of the particles of activated carbon powder for quantities of charge, are used in combination for removing the metallic surfaces.

Referring now to the drawings in detail, FIG. 1, which shows the apparatus for carrying out the method of the present invention, comprises an electrolysis cell 1 having an anode 2 and a cathode 3. A diaphragm 4 is arranged between the electrodes 2 and 3 of the electrolysis cell 1. The diaphragm 4 divides the electrolysis cell 1 into two cell regions. The cell region 5 of the electrolysis cell 1 contains the anode 2 as well as an electrolyte in which are suspended electrically conductive bodies which are electrically charged on the anode 2. The electrically conductive bodies are prevented by the inserted diaphragm 4 from passing into the cell region 6, in which is located the cathode 3.

In the embodiment shown in FIG. 1, the anode 2 is rotated by an electric motor 7. By means of its rotation in the electrolysis cell 1, the anode 2 generates a movement of the electrolyte in such a manner that the electrolyte, with its anodically charged, electrically conductive bodies, is brought into contact with the surface of a workpiece 8 which is to be processed. No electrically conductive connection exists between the workpiece 8 and the electrodes of the electrolysis cell 1. The anodically charged electrically conductive bodies suspended in the electrolyte release their charge on the surface to be processed of the workpiece 8. In this connection, in conformity with the electrochemical charge equivalent, ions are released into the electrolyte. If, for example, workpieces having a copper surface are to be processed, copper ions are released and are again deposited on the cathode 3 of the electrolysis cell 1. The discharged electrically conductive bodies are again charged on the anode 2 by the movement of the electrolyte and are again in the cycle supplied to the workpiece.

Example 1

20 g of commercial activated carbon powder was suspended in 150 cm$^3$ of diluted 0.5 normal sulfuric acid and was anodically polarized in the amode chamber of the electrolysis cell while being intensively stirred. A discharge was prevented by the diaphragm 4 which is impervious to activated carbon particles.

For a potential difference ΔE between activated carbon particles and a metallic surface of +0.7 V, coulombmetric measurements in the electrolysis cell resulted in a quantity of charge Q of 75 coulombs per gram of activated carbon powder, which charge was transferrable to the metallic surface and was to be stored up by means of the particles suspended in the electrolyte. 40 g of activated carbon powder were therefore brought into contact with the metallic surface for every gram of copper to be dissolved.

The charge transfer between the particles suspended in the electrolyte and the metallic surface to be processed was measured potentiostatically. For this purpose, instead of a workpiece to be processed, a third electrode, as a discharge electrode, with a surface of 15 cm$^2$ was brought into contact with the electrolyte. This electrode was adjusted to the electrical potential of copper, which conforms to a voltage of +0.34 V relative to a normal hydrogen electrode. The transferred current J was measured at a potential difference ΔE between activated carbon powder particles and discharge electrode of +0.6 V. During the measurement, the anode 2 had a speed of rotation of 400 rpm. While maintaining these conditions, 60 mA were transferred, corresponding to a copper dissolving rate of 1.18 mg per minute.

EXAMPLE 2

20 g of commercial activated carbon powder, which was heated at 1000° C in a nitrogen atmosphere for more than one hour, was suspended in 150 cm$^3$ diluted, 0.5 normal sulfuric acid and was anodically polarized in the same manner as in Example 1. The quantity of charge Q which was to be stored up and to be transferred to the metallic surface was 125 coulombs per gram of activated carbon powder at a potential difference ΔE between activated carbon particles and metallic surface of +0.7 V. 24 g activated carbon powder was therefore brought into contact with the metallic surface for every gram of copper to be dissolved.

The charge transfer was determined in the same manner as in Example 1. Under the same conditions, the transferred current was 360 mA, corresponding to a dissolving rate of the copper surface of 7.1 mg per minute.

FIG. 2 shows a comparison of the results using electrolyte suspension containing commercial activated carbon powder and also containing activated carbon powder which has been heated in an inert atmosphere. It is obvious (curve III) that with the use in the electrolyte of activated carbon powder, which has been heated in an inert atmosphere, within the range of potential differences ΔE up to 0.66 V, the charge transfer is increased not only with regard to graphite powder particles suspended in the electrolyte (curve I), but also with regard to commercial activated carbon powder (curve II). With an electrolyte which contains activated carbon powder particles heated at 1000° C in a nitrogen atmosphere for more than one hour, it is possible, at a potential difference ΔE of 0.6 V, to transfer approximately four times the current J (curve III). The quantity of charge Q to be stored up by means of the particles suspended in the electrolyte is plotted in FIG. 3 within the range of potential differences ΔE up to +0.66 V. The curves are labeled to correspond to those of FIG. 2, i.e. curve 1 represents an electrolyte suspension with graphite powder; curve II represents an electrolyte suspension with commercial activated carbon powder; and curve III represents an electrolyte suspension with heated activated carbon powder particles. Per gram of suspended electrically conductive bodies in the electrolyte, the quantity of charge Q to be stored up and located in the electrolyte is the highest when heated activated carbon powder is used. Therefore, with heated activated carbon powder, per gram of metal to be dissolved, the least number of particles need be brought into contact with the surface to be processed.

Similar results also appear with the use of activated carbon powder which has been heated at 700, 800, or 900° C in an inert gas atmosphere for more than one hour. The best results, however, are achieved at heating temperatures between 900 and 1200° C.

EXAMPLE 3

20 g of activated carbon powder, which was heated at 1100° C in a nitrogen atmosphere for more than one hour, was suspended in 150 cm$^3$ diluted, 0.5 normal sulfuric acid and was anodically polarized in the same manner as in Examples 1 or 2. By charging with a current of 50 mA, after 20 hours a potential difference ΔE of +0.9 V was achieved between the activated carbon powder and a copper surface. Subsequently thereto, one gram of graphite powder, corresponding to 5% of the entire amount of supplied electrical conducting bodies, was additionally suspended in the electrolyte. In the same current of 50 mA, the potential difference ΔE thereupon increased after one hour by about 0.07 V to 0.97 V, that is, by about 8%. If more graphite is added, the potential difference which may be achieved increases even further.

It is, of course, to be understood that the present invention is by no means limited to the specific showing in the drawings or to the descriptions of the examples, but also encompasses any modifications within the scope of the appended claims.

For example, the workpiece to be processed with electrolyte need not necessarily be located inside the electrolysis cell, but may also be located outside said cell. Such an embodiment is illustrated in FIG. 1 of the cited U.S. Pat. No. 3,974,050. The method of the present invention was carried out with such an apparatus as follows.

For processing copper covered plates, 20% by weight of activated carbon particles of a size of up to 0.02 mm were added to an electrolyte which contained 10% sulfuric acid and a copper salt containing up to 100 grams copper per liter. During the period of operation, the necessary cell voltage remained constant in the electrolytic cell at 1.8 V with 20A current flow. Also, the diaphragm remained well permeable. A portion of the suspension was pumped through the spray nozzle at a volume of 1 liter/min. onto a copper laminated workpiece, and was then returned to the anode compartment of the cell. In this process, 150 mg copper per minute went into solution from the workpiece.

What we claim is:

1. A method of electrochemically processing metallic surfaces of workpieces with an electrolysis cell having two electrodes, which includes in combination the steps of:
  adding an electrolyte to said electrolysis cell;
  adding to and suspending in said electrolyte specially treated particles of activated carbon powder heated at a temperature above 700° C in an inert atmosphere and providing a high storage capacity for electrical charges;
  bringing said workpiece into contact with said electrolyte in such a way that said workpiece does not contact said electrodes;
  charging said particles of activated carbon powder on one of said electrodes so that said particles conduct an electrical charge to said workpiece; and
  shielding the other of said electrodes so that said charged particles of activated carbon powder cannot discharge thereon.

2. A method of electrochemically processing metallic surfaces in combination according to claim 1, in which said workpiece is located inside said electrolysis cell.

3. A method of electrochemically processing metallic surfaces in combination according to claim 1, in which said workpiece is located outside said electrolysis cell.

4. A method of electrochemically processing metallic surfaces in combination according to claim 1, in which particles of activated carbon powder which have been heated at temperatures between 900 and 1200° F for more than one hour are added to and suspended in said electrolyte.

5. A method of electrochemically processing metallic surfaces in combination according to claim 1, in which graphite powder is added to said activated carbon powder.

* * * * *

UNITED STATES PATENT AND TRADEMARK OFFICE
CERTIFICATE OF CORRECTION

PATENT NO. : 4131523
DATED : 26 December 1978
INVENTOR(S) : WOLFGANG FAUL AND BERTEL KASTENING It is certified that error appears in the above-identified patent and that said Letters Patent are hereby corrected as shown below:

Claim 4, line 4, cancel "°F" and insert --°C--.

Signed and Sealed this

Twenty-fifth Day of September 1979

[SEAL]

Attest:

LUTRELLE F. PARKER
*Attesting Officer*  *Acting Commissioner of Patents and Trademarks*